(12) United States Patent
Urban et al.

(10) Patent No.: US 11,703,546 B2
(45) Date of Patent: Jul. 18, 2023

(54) MANAGEMENT OF MODULAR SUBSYSTEMS USING VARIABLE FRAME LENGTH

(71) Applicant: Texas Instruments Incorporated, Dallas, TX (US)

(72) Inventors: Tomas Urban, Freising (DE); Kyl Wayne Scott, Richardson, TX (US); Hans-Georg Christian Haeck, Erding (DE); Ariton E. Xhafa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/313,620

(22) Filed: May 6, 2021

(65) Prior Publication Data

US 2022/0137139 A1    May 5, 2022

Related U.S. Application Data

(60) Provisional application No. 63/107,659, filed on Oct. 30, 2020.

(51) Int. Cl.
```
G01R 31/36      (2020.01)
G01R 31/367     (2019.01)
G01R 31/396     (2019.01)
G01R 31/3842    (2019.01)
G01R 31/378     (2019.01)
```

(52) U.S. Cl.
CPC ....... *G01R 31/3648* (2013.01); *G01R 31/367* (2019.01); *G01R 31/378* (2019.01); *G01R 31/3842* (2019.01); *G01R 31/396* (2019.01)

(58) Field of Classification Search
CPC .............. G01R 31/3648; G01R 31/396; G01R 31/3842; G01R 31/367; G01R 31/378
See application file for complete search history.

(56) References Cited

U.S. PATENT DOCUMENTS

| | | | |
|---|---|---|---|
| 7,622,929 B2 | 11/2009 | Finnemeyer et al. | |
| 2007/0090844 A1 | 4/2007 | Klang | |
| 2009/0009183 A1* | 1/2009 | Mousavi | G05B 23/027 324/537 |
| 2013/0271072 A1 | 10/2013 | Lee et al. | |

(Continued)

FOREIGN PATENT DOCUMENTS

| | | | |
|---|---|---|---|
| CN | 105974297 A | * | 9/2016 |
| RU | 2686072 C1 | | 4/2019 |

OTHER PUBLICATIONS

International Search Report and Written Opinion, International Patent Application No. PCT/US 2021/056409, dated Jan. 13, 2022, 7 pages.

*Primary Examiner* — Yoshihisa Ishizuka
(74) *Attorney, Agent, or Firm* — Carl G. Peterson; Frank D. Cimino

(57) ABSTRACT

A monitor circuit for use in a management system with modular subsystems includes: a sensor configured to measure parameter values of a monitored electrical component as a function of time; and storage coupled to the sensor and configured to store the parameter values. The monitor circuit also includes frame preparation circuitry coupled to the storage and configured to prepare frames that include the parameter values, wherein the prepared frames vary in length as a function of time.

25 Claims, 7 Drawing Sheets

(56) References Cited

U.S. PATENT DOCUMENTS

| | | |
|---|---|---|
| 2016/0114696 A1 | 4/2016 | Eifert et al. |
| 2020/0386822 A1* | 12/2020 | Weiss .................. G01R 31/367 |
| 2021/0044511 A1* | 2/2021 | Connolly ......... G01R 31/31723 |
| 2021/0066763 A1* | 3/2021 | Seon ....................... H04W 4/70 |

\* cited by examiner

MANAGEMENT OF MODULAR SUBSYSTEMS USING VARIABLE FRAME LENGTH

CROSS-REFERENCE TO RELATED APPLICATIONS

This application claims priority to U.S. Provisional Application No. 63/107,659, filed Oct. 30, 2020, which is hereby incorporated by reference.

BACKGROUND

As new electronic devices are developed and integrated circuit (IC) technology advances, new IC products are commercialized. One example IC product for electronic devices is a monitor circuit for rechargeable batteries or electronic components. In a conventional wired battery management system, rechargeable batteries are managed by circuitry, including monitor circuits, for the safe and efficient operation of the batteries in real-life applications, such as electric vehicles. The wired communication interfaces are used to connect a main microcontroller to each battery module, and each battery module is chained to the rest of the battery modules in a daisy chain. Wired battery management systems utilize a serial wire communication line and a proprietary protocol with deterministic frame timing. The data transfer configuration of wired battery management systems allows excluding some types of failure modes and safety mechanisms such as a frame counter, while enabling detection of a sufficient amount of communication errors to achieve a target functional safety integrity level. With wired communication interfaces, the main microcontroller cannot monitor and control all the battery modules in parallel without complex wiring. This wiring makes repair or replacement of individual battery cells more difficult.

Use of a wireless connection between the battery modules and the main microcontroller has been proposed to make management of battery modules more flexible and easier to repair. In a wireless battery management system (WBMS), the microcontroller monitors each battery module and communicates with the battery modules using wireless communication interfaces. Some WBMSs or related ICs may lack a frame counter or other communication safety mechanisms developed for wired battery management systems to detect errors such as: unintended repetition of a frame; incorrect sequence of a frame; loss of a frame; and insertion of a frame. Without a frame counter or other these communication safety mechanisms, wireless communication interfaces are vulnerable to errors or attacks that would prevent proper monitoring and management in a WBMS.

SUMMARY

In at least one example, a monitor circuit for use in a management system with modular subsystems includes: a sensor configured to measure parameter values of a monitored electrical component as a function of time; and storage coupled to the sensor and configured to store the parameter values. The monitor circuit also includes frame preparation circuitry coupled to the storage and configured to prepare frames that include the parameter values, wherein the prepared frames vary in length as a function of time.

In another example, a system comprises: a primary controller; and modular subsystems in communication with the primary controller. Each of the modular subsystems has: an electrical component; and a monitor circuit coupled to the electrical component. The monitor circuit is configured to: obtain parameter values from monitoring the electrical component; store the parameter values; and prepare frames with the stored parameter values for transmission to the primary controller, the prepared frames varying in length as a function of time.

In yet another example, a frame counter emulation method in a communication system with a primary controller and modular subsystems comprises: obtaining, by a monitor circuit, parameter values of a monitored electrical component as a function of time; and storing, by the monitor circuit, the parameter values. The method also comprises preparing, by the monitor circuit, frames that include the parameter values. The prepared frames vary in length as a function of time. The method also comprises transmitting, by the monitor circuit, the prepared frames.

BRIEF DESCRIPTION OF THE DRAWINGS

The same reference numbers are used in the drawings to depict the same or similar (structurally and/or functionally) features.

DETAILED DESCRIPTION

Described herein are variable frame length options to provide functional safety and/or communication error identification in a management system with a primary controller and modular subsystems. Between the primary controller and the modular subsystems is a wired or wireless communication interface. Each modular subsystem includes a monitor circuit and a monitored electrical component. In some example embodiments, the monitor circuit includes: a sensor configured to measure parameter values of a monitored electrical component as a function of time; storage coupled to the sensor and configured to store the parameter values; and frame preparation circuitry coupled to the storage. In some example embodiments, the sensor is a voltage sense circuit or current sense circuit, and the monitored electrical component is a rechargeable battery. The frame preparation circuitry is configured to prepare frames that include the parameter values, where the prepared frames vary in length as a function of time. In some example embodiments, the frame length varies based on a predetermined frame length pattern that is stored or generated by the frame preparation circuitry. As another option, the frame preparation circuitry is configured to prepare frames with different lengths as a function of time based on instructions received from the primary controller. As another option, the frame preparation circuitry is configured to prepare frames with different lengths as a function of time based on information included with each parameter query received from the primary controller. For example, the different frame length settings may be included with parameter queries received from the primary controller. As another option, the frame preparation circuitry is configured to prepare frames with different lengths as a function of time as a response to individual queries from the primary controller. By using frames with varying lengths, frame counting is emulated without the expense of a frame counter. Distinguishing between frames enables detection of safety issues or communication errors such as: repetition, deletion, insertion, re-sequence, corruption, and/or delay.

Figure 1:
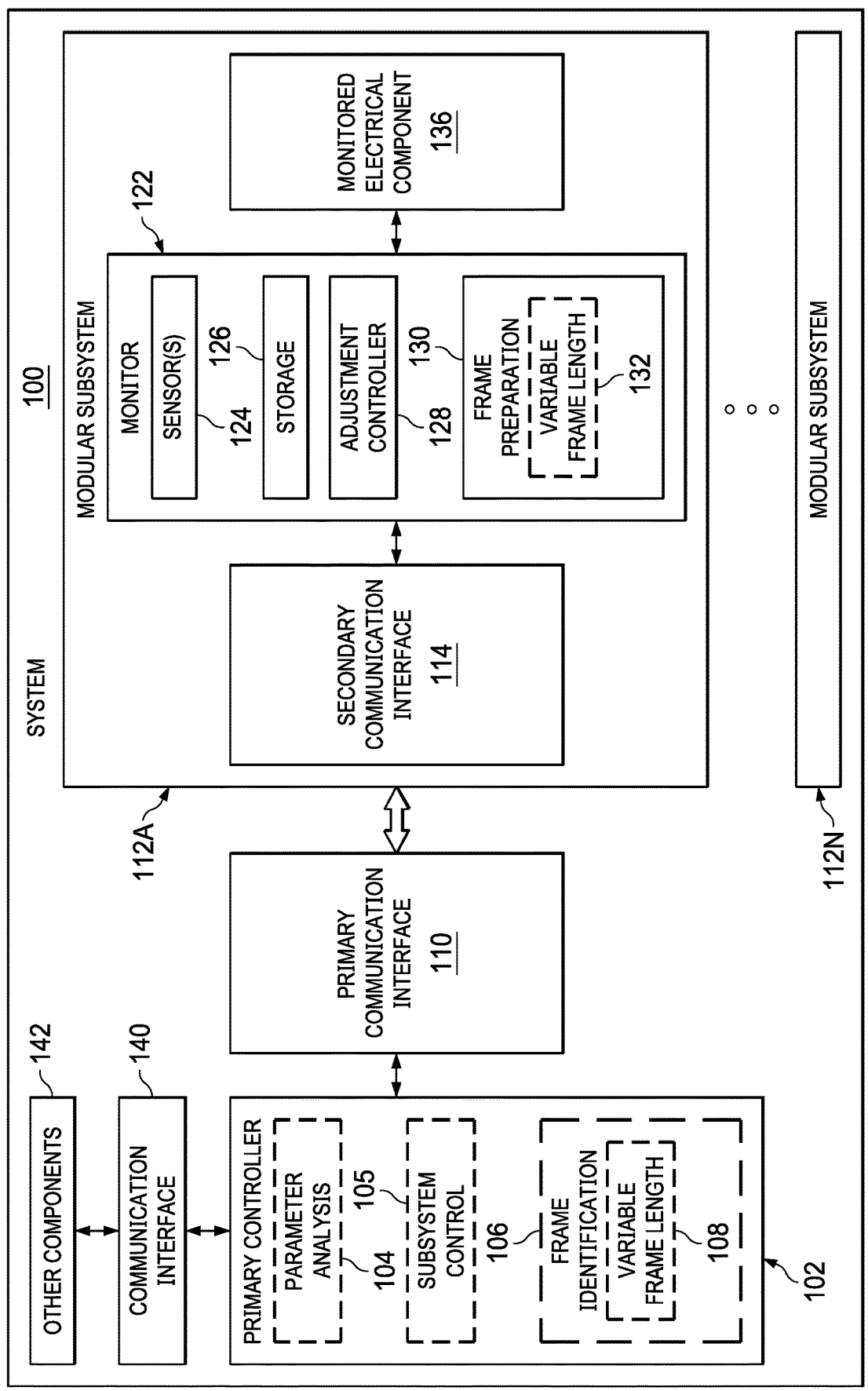
FIG. 1 is a block diagram of a system with modular subsystems and variable frame length use in accordance with an example embodiment.

FIG. 1 is a block diagram of a system 100 with modular subsystems 112A-112N and variable frame length use in accordance with an example embodiment. As shown, the system 100 includes a primary controller 102 coupled to a primary communication interface 110. The primary communication interface 110 may be wired or wireless. In some example embodiments, the primary controller 102 includes parameter analysis element 104, subsystem control element 105, and frame identification element 106. The parameter analysis element 104 includes hardware, firmware, and/or software configured to analyze parameter values received from the modular subsystems 112A-112N. For example, the parameter analysis element 104 is configured to determine how the monitored electrical components 136 of the modular subsystems 112A are behaving individually and in combination. As an example, if the system 100 is a battery management system and the monitored electrical components 136 are rechargeable batteries, the parameter analysis element 104 is configured to determine the behavior of the batteries individually and in combination.

The subsystem control element 105 includes hardware, firmware, and/or software configured to control or direct the modular subsystems 112A-112N with regard to the monitored electrical components 136 and related operations. At least in part, the subsystem control element 105 uses the results of the parameter analysis element 104 to determine instructions for the modular subsystems 112A-112N and related components to manage each respective monitored electrical component 136 as a function of time.

The frame identification element 106 includes hardware, firmware, and/or software configured to identify frames received from the modular subsystems 112A-112N. As shown, the frame identification element 106 includes variable frame length instructions or settings 108 that identify an expected frame length for frames received from the modular subsystems 112A-112N. In some example embodiments, the expected frame length varies over time according to different data collection cycles for each of the modular subsystems 112A-112N or for all of the modular subsystem 112A-112N. In some example embodiments, data collection cycles are initiated by the primary controller 102. In other example embodiments, data collection cycles are initiated by the modular subsystems 112A-112N using a predetermined schedule, a shared schedule, or other technique.

As shown, the modular subsystem 112A includes a secondary communication interface 114. The secondary communication interface 114 may be a wired or wireless communication interface. The modular subsystem 112A also includes a monitor circuit 122 coupled to the secondary communication interface 114. In the example of FIG. 1, the monitor circuit 122 includes sensor(s) 124, storage 126, an adjustment controller 128, and a frame preparation element 130. In some example embodiments, the sensor(s) 124 include a voltage sensor and/or current sensor configured to obtain voltage and/or current sense values regarding the monitored electrical component 136. In other example embodiments, the sensor(s) 124 track parameters such as temperature, power, or other parameters.

The storage 126 is volatile or non-volatile memory (e.g., random-access memory (RAM), read-only memory (ROM), flash memory, etc.) configured to store parameter values obtained by the sensor(s) 124. The adjustment controller 128 includes circuitry configured to adjust features or settings of the monitored electrical component 136f. As an example, if the system 100 is a battery management system, the adjustment controller 128 may be configured to adjust recharge settings of a battery responsive to ongoing monitoring and analysis of parameter values for individual batteries and/or all batteries in the system 100.

In the example of FIG. 1, the frame preparation element 130 includes circuitry, hardware, firmware, and/or software configured to prepare frames with a variable frame length as described herein. Example frames include parameter values obtained by sensor(s) 124, where different frames vary in length as a function of time. In some example embodiments, the frame length varies based on a predetermined frame length pattern that is stored or generated by the frame preparation element 130. As another option, the frame preparation element 130 is configured to prepare frames with different lengths as a function of time based on instructions received from the primary controller 102. As another option, the frame preparation circuitry is configured to prepare frames with different lengths as a function of time based on information included with each parameter query received from the primary controller 102. For example, the different frame length settings may be included with parameter queries received from the primary controller 102. As another option, the frame preparation element 130 is configured to prepare frames with different lengths as a function of time as a response to individual queries from the primary controller 102.

Without limitation, each of the modular subsystems 112B-112N may have the same topology as the modular subsystem 112A. As desired, the functionality of monitored electrical components, such as the monitored electrical component 126, for each of the modular subsystems 112B-112N is combined and the combined functionality of all of the monitored electrical components is also monitored and adjusted as needed. Over time, the performance of the monitored electrical components and/or other components of the modular subsystem 112A-112N may degrade. In such case, adjustment or replacement of a specific monitored electrical component or other components of a given modular subsystem may be needed. By using wireless interfaces for the primary and secondary communication interfaces 110 and 114, such replacement is facilitated (i.e., fewer wired connections are used) while supporting monitoring, adjustment, status update, parameter transfer, and/or data storage operations for the monitored electrical components of the modular subsystems 112A-112N. However, it should be appreciated that the variable frame length options described herein can be used with wired communication interfaces.

In FIG. 1, the primary controller 102 is also coupled to other components 142 via a communication interface 140. An example of the other components 142 is an electronic control unit (ECU), which manages the electrical subsystems of a vehicle or other system responsive to the ongoing status and operations of the modular subsystems 112A-112N.

Figure 2:
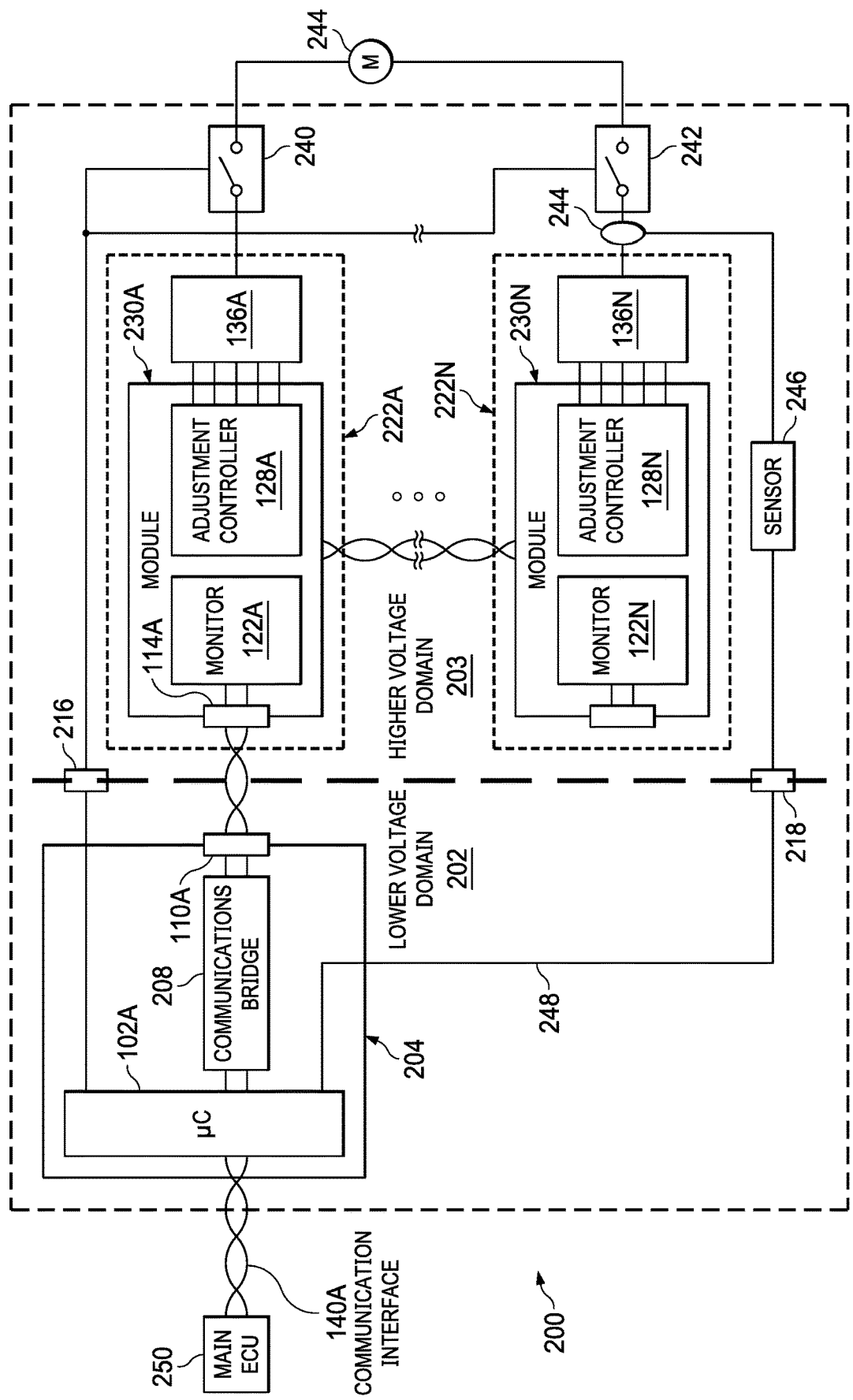
FIG. 2 is a block diagram of another system with modular subsystems and variable frame length use in accordance in accordance with another example embodiment.

FIG. 2 is a block diagram of a system 200 with modular subsystems 222A-222N (examples of the modular subsystems 112A-112N in FIG. 1) and variable frame length use in accordance with another example embodiment. In FIG. 2, the system 200 includes a lower voltage (e.g., 12, 24, or 48 volts) domain 202 with a control circuit 204. In the example of FIG. 2, the modular subsystems 222A-222N are in a higher voltage (e.g., several hundreds of volts) domain 203 compared to the control circuit 204. As shown, the control circuit 204 includes a microcontroller 102A (an example of the primary controller 102 in FIG. 1) and a wired communication interface 110A (an example of the primary communication interface 110 in FIG. 1). The control circuit 204 also includes a communications bridge 208 between the microcontroller 102A and the wired communication interface 110A. In the example of FIG. 2, a main ECU 250 for the system 200 is coupled to the control circuit 204 via a communication interface 140A (an example of the communication interface 140 in FIG. 1).

As shown, the modular subsystem 222A includes a module 230A, such as a printed circuit board (PCB) or other circuit, with a wired communication interface 114A (an example of the secondary communication interface 114 in FIG. 1), a monitor circuit 122A (an example of the monitor circuit 122 in FIG. 1), and an adjustment controller 128A (an example of the adjustment controller 128 in FIG. 1). The module 230A is coupled to a monitored electrical component 136A (an example of the monitored electrical component 136 in FIG. 1). The modular subsystems 222B-222N each include a respective module 230B-230N coupled to a respective monitored electrical component 136B-136N. In some example embodiments, the monitored electrical components 136A-136N are rechargeable batteries or other components with a variable status. Without limitation, each the modules 230B-230N include the same type of components as the module 230A (e.g., wireless interface, a monitor, and an adjustment controller).

In FIG. 2, the monitored electronic components 136A-136N may be coupled together to provide a combined function. As shown, the system 200 includes switches 240, 242, and component 244. In some example embodiments, the component 244 is a motor/engine. In this case, closing the circuit at 240 and 242, results in current flowing through the engine/motor to operate a vehicle. During the parking or when the car is OFF, the circuit is open and no energy is wasted. The switch 240 is controlled by a control signal from the microcontroller 102A, which is conveyed to the switch 240 via interface 216. In FIG. 2, the microcontroller 102A also receives a current sense signal 248 via interface 218, where the current sense signal 248 is generated from a loop 245 or related sensor 246.

In some example embodiments, the wired communication interface 110A is configured to send parameter queries to the modular subsystems 222A-222N using an addressing scheme. As another option, the wired communication interface 110A is configured to receive frames with parameter values from the modular subsystems 222A-222N. The frames received from the modular subsystems 222A-222N may be response frames (frames generated in response to parameter queries from the microcontroller 102A) or scheduled frames (e.g., frames generated according to predetermined data update cycles). In either case, a variable frame length is used to facilitate detection of communication errors and/or safety issues.

Figure 3:
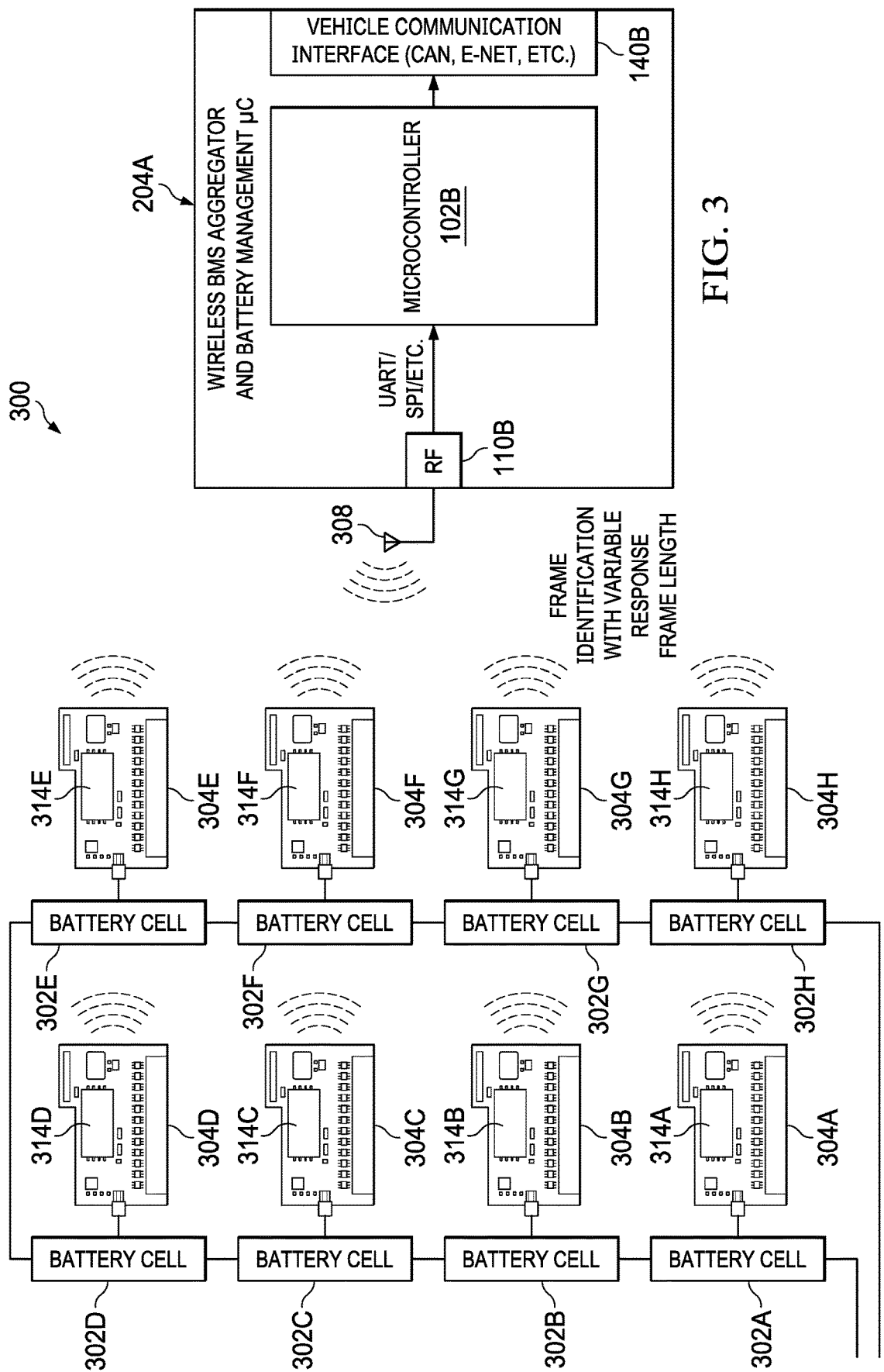
FIG. 3 is a diagram of a wireless battery management system (WBMS) with modular subsystems and variable frame length use in accordance with an example embodiment.

FIG. 3 is a diagram of a wireless battery management system (WBMS) 300 and variable frame length use in accordance with an example embodiment. As shown, the WBMS 300 includes battery cells 302A-302H (e.g., Li-ion cells) in series. Each of the battery cells 302A-302H is coupled to a respective module 304A-304H (examples of the modules 222A-222N) to form respective modular subsystems (e.g., the battery cell 302A and the module 304A is an example of the modular subsystem 112A in FIG. 1, or the modular subsystem 222A in FIG. 2). Each of the modules 304A-304H includes a respective wireless interface 314A-314H (examples of the secondary communication interface 114 in FIG. 1) to perform monitoring, adjustment, and/or wireless communication operations involving variable frame length use as described herein. The WBMS 300 also includes a control circuit 204A (an example of the control circuit 204 in FIG. 2) with a microcontroller 102B (an example of the microcontroller 102 in FIG. 1), a wireless transceiver 110B (an example of the primary communication interface 110 in FIG. 1), and a communication interface 140B (an example of the communication interface 140 in FIG. 1). The control circuit 204A is coupled to an antenna 308 for wireless communications with the modules 304A-304H. In operation, the wireless interface 110B is configured to receive frames with variable frame lengths as described herein.

With the WBMS 300, the functionality of the battery cells 302A-302H is combined and the combined functionality of all of the battery cells 302A-302H is monitored and adjusted. Over time, the performance of the battery cells 302A-302H may degrade. In such case, adjustment or replacement of a specific one of the battery cells 302A-302H or other components of the modular subsystems may be needed. By using the wireless interface 110B and respective wireless interfaces 314A-314H of the modules 304A-304H, such replacement is facilitated while supporting monitoring, adjustment, status update, parameter transfer, and/or other operations related to the battery cells 302A-302H. The use of variable frame length in the WBMS 300 helps ensure proper management for the battery cells 302A-302H by facilitating detection of communication errors and/or safety issues as described herein.

In some example embodiments, a system (e.g., the systems 100, 200, 300 in FIGS. 1-3) includes: a primary controller (e.g., the primary controller 102, 102A, and 102B in FIGS. 1-3); and modular subsystems (e.g., the modular subsystems 112A-112N, 222A-222N, and 304A-304H in FIGS. 1-3) in communication with the primary controller. Each of the modular subsystems has: an electrical component (e.g., monitored electrical component 136 and 136A in FIGS. 1 and 2); a monitor circuit (e.g., monitor 122 and 122A in FIGS. 1 and 2) coupled to the electrical component. The monitor circuit is configured to: obtain parameter values from monitoring the electrical component; store the parameter values; and prepare frames with the stored parameter values for transmission to the primary controller, the prepared frames varying in length as a function of time.

In some example embodiments, the monitor circuit includes frame preparation circuitry (e.g., frame preparation element 130 in FIG. 1) configured to prepare frames with different lengths as a function of time based on a predetermined frame length pattern stored or generated by the frame preparation circuitry. As another option, the monitor circuit may include frame preparation circuitry configured to prepare frames with different lengths as a function of time based on instructions received from the primary controller. As another option, the monitor circuit includes frame preparation circuitry configured to prepare frames with different lengths as a function of time based on a setting included with each parameter query received from the primary controller. As another option, the monitor circuit includes frame preparation circuitry configured to prepare frames with different lengths as a function of time based on different frame length settings included with parameter queries received from the primary controller. As another option, the monitor circuit includes frame preparation circuitry configured to prepare frames with different lengths as a function of time as a response to individual queries from a primary controller of the management system. In some example embodiments, the frame preparation circuitry is configured to: obtain a frame length setting from each of the individual queries; and use the obtained frame length settings to prepare response frames for each of the individual queries. While wired communication interfaces are possible, other example embodiments include: a primary wireless communication interface coupled to the primary controller; and a secondary wireless communication interface for each respective modular subsystem. In some example embodiments, the monitored electrical component is a rechargeable battery.

In some example embodiments, a primary controller helps manage variance of the length of response frames from the secondary wireless interfaces each refresh cycle. The response frames from the secondary wireless interfaces will have the length requested by the primary controller when no errors are present. In some example embodiments, the total length of a safety-relevant data frame is:

$$L_{TOT}=L_H+L_{PL}=L_H+L_{PL\_F}+L_{PL\_V} \quad \text{Equation 1}$$

In Equation 1, $L_{TOT}$ is the total frame length, $L_H$ is a frame header (e.g., address, frame length, cyclic redundancy check or "CRC"), and $L_{PL}$ is the length of the payload. In some example embodiments, $L_{PL}$ may vary. More specifically, $L_{PL}$ may be divided into a fixed payload portion ($L_{PL\_F}$) and a variable payload portion ($L_{PL\_V}$). For example, $L_{PL\_F}$ is used for data transfers (e.g., parameter values), while $L_{PL\_V}$ is a variable set of dummy bytes (e.g., the number of dummy bytes that vary for different frames). The variable dummy bytes may be discarded after the transmission. As another option, there are no variable dummy bytes. Instead, the payload length used for data transfers varies over time. In either case, the total the variable frame length emulates a frame counter without the expense of the frame counter hardware.

Figure 4:
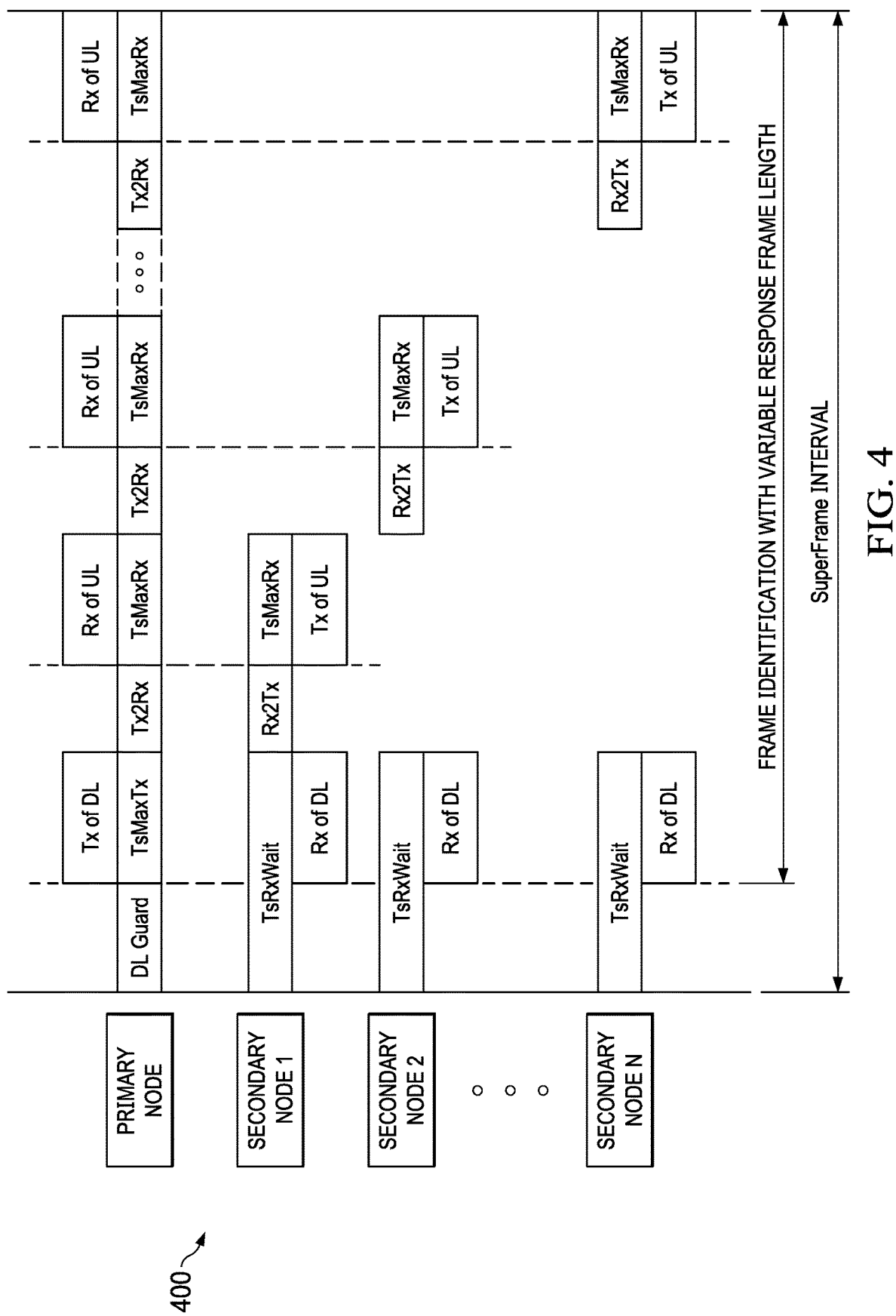
FIG. 4 is a diagram of a wireless management network protocol in accordance with an example embodiment.

FIG. 4 is a diagram of a wireless management network protocol 400 in accordance with an example embodiment. The protocol 400 supports data exchanges between a primary controller and N-secondary nodes (part of each modular subsystem) in a wireless management system or WBMS. In FIG. 4, time is divided into slots, where the primary node transmits packets in the downlink (DL) slot, while the secondary nodes transmit their data packets in their respective uplink (UL) slots. The total time interval that includes a single DL slot (for the primary node to transmit) and respective UL slots for the secondary nodes to transmit their packets is called a Superframe interval. In FIG. 4, the DL slots may be used to transmit parameter queries from the primary controller to the modular subsystems. The UL slots may be used to transmit frames with parameter values and variable frame lengths as described herein.

Figure 5:
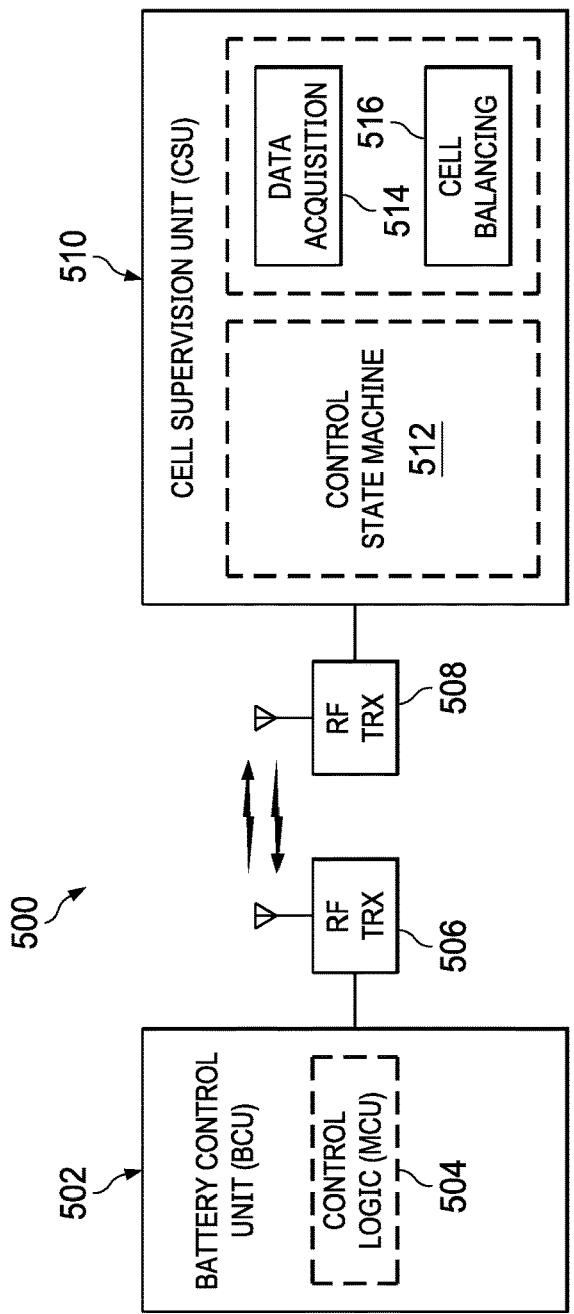
FIG. 5 is a diagram of a battery control unit (BCU) and a cell supervisory unit (CSU) in accordance with an example embodiment.

FIG. 5 is a diagram of a battery control unit (BCU) 502 (e.g., the primary controller 102, 102A, and 102B in FIGS. 1-3) and a cell supervisory unit (CSU) (e.g., the monitor circuit 122 and 122A in FIGS. 1 and 2) in accordance with an example embodiment. The BCU 502 and the CSU 510 may be part of a management system for monitored electrical components (e.g., part of the systems 100, 200, and 300 in FIGS. 1-3). As shown, the battery control unit 502 includes control logic 504 such as a microcontroller (MCU). In FIG. 5, the BCU 502 is coupled to a wireless transceiver 506 configured to send and receive wireless data using frames. Also, the CSU 510 includes a control state machine 512 (an example of the frame preparation element 130 in FIG. 1), a data acquisition block 514 (e.g., with sensor(s) 124 as in FIG. 1), and cell balancing block 516 (an example of the adjustment controller 128 in FIG. 1).

With a variable frame length, a safety communication layer is provided between the BCU 502 and the CSU 510 to mitigate risk of various communication errors. Example communication errors include: unintended repetition of data frames; incorrect data frame sequence; loss of data frame; and/or insertion of an incorrect data frame.

In some example embodiments, variable frame length use is based on a request-response principle. Without limitation, several architectural assumptions need to be made: 1) in errorless operation, the wireless communication channel appears to be transparent for data frame exchange between the BCU 502 and the CSU 510; 2) any CSU 510 in the system will not communicate with the BCU 502 without being requested; 3) the MCU 504 in the BCU 502 is the one and only node that can request transmission of the functional safety-relevant data and evaluates their validity, integrity, authenticity and correct timing; 4) the MCU 504 in the BCU 502 requests the data from the battery modules and cells respectively in the form of a command frame; 5) the command frame sent by the BCU 502 to the CSU 510 must be able to specify the length of each response frame's payload sent by the CSU 510 towards the BCU 502; 6) the payload length of frames both sent and received is solely determined by the MCU 504; and 7) the above applies even when the communication between the MCU 504 and the CSU 510 is done via an intermediate CSU. This is because the command and response frames are between the two end nodes and the intermediate node is merely a relay node.

In some example embodiments, variable frame length use as described herein solves communication errors by specifying and deterministically varying the payload length of response frames expected to be received by the BCU 502. The payload length is varied by changing the range of values to be read while adding dummy reads to the response frame, which may contain no useful data. Taking the above assumptions into account and with the deterministically variable-length approach, the variable frame lengths allow the MCU 504 to uniquely identify the frames at receipt. With the described techniques, frame counter functionality is emulated to uniquely identify frames without the need for additional hardware. In some example embodiments, the response frame includes: a fixed-length header specific to a particular communication protocol; and a variable payload. In some example embodiments, the headers include payload length information, which simplifies the implementation of the error detection mechanism.

Specification of variable response frame length as described above may be used to detect communication errors by the MCU 504. By strictly keeping the MCU 504 in charge of sending the request frames, the MCU 504 can detect communication errors as it is summarized in the following Table 1.

TABLE 1

Communication error detection

| Communication error | Description of the error | Error detection mechanism |
| --- | --- | --- |
| Unintended repetition | Due to an error, fault or interference, messages are repeated. | Identical value of $L_{PL\_V}$ received in subsequent frames. |
| Incorrect sequence | Due to an error, fault or interference, the predefined sequence (for example natural numbers, time references) associated with messages from a particular source is incorrect. | Unexpected sequence of values $L_{PL\_V}$ received. |
| Loss | Due to an error, fault or interference, a message or acknowledgment is not received. | Frame with consequent expected $L_{PL\_V}$ value is not received. |
| Insertion | Due to a fault or interference, a message is received that relates to an unexpected or unknown source entity. | Received value of $L_{PL\_V}$ is unexpected. NOTE: This is valid only when each entity has different frame length requested. |

Example automotive battery monitoring chips support monitoring up to 16 lithium-based cells in series. These automotive battery monitoring chips are developed in line with ISO26262 and enable systematic capability up to automotive safety integrity level (ASIL). As needed, automotive battery monitoring chips can be daisy-chained with others when a larger than 16 cell battery needs to be monitored. The automotive battery monitoring chip communicates with the primary controller via serial bus on a command-response basis. This serial wire communication can be replaced with a communication system based on a proprietary WBMS protocol and wireless connectivity chip. A combination of the WBMS protocol and wireless connectivity chips enables transparent communication of the MCU 504 to each of the battery monitors.

In some example embodiments, during normal operations, the MCU 504 does not handle the WBMS protocol at all. Rather, the MCU 504 helps manage operations of the CSU 510 using a compatible wired communication protocol. In this example, a communication protocol (e.g., the BQ protocol) of the CSU 510 uses the following structure for frames both sent and received. To demonstrate the frame identification with this example, the command frame is sent by the MCU 504. This frame instructs the CSU 510 to send out the functional safety-related data from the CSU's storage (e.g., register space) with the next response frame to the MCU 504.

Figure 6:
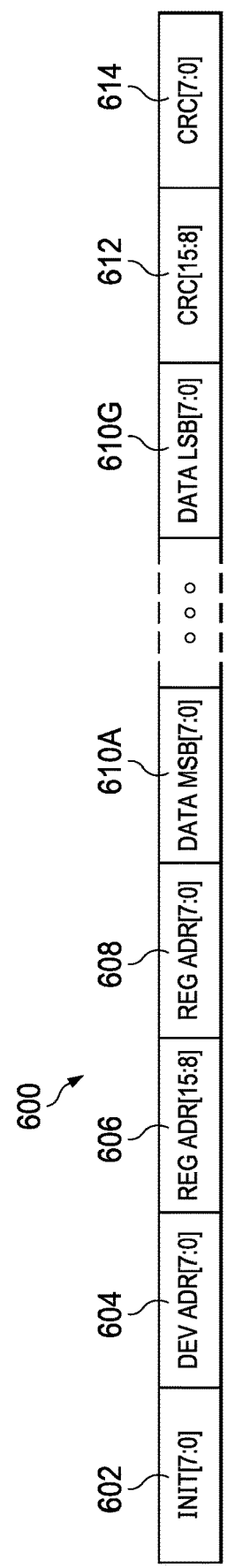
FIG. 6 is a diagram of a frame in accordance with an example embodiment.

In some example embodiments, the MCU 504 awaits a response from the CSU 510 in the format shown in frame 600 of FIG. 6. As shown, the frame 600 includes an initialization section (labeled INIT[7:0]) 602, a first address section (labeled DEV ADR[7:0]) 604, a second address section (labeled REG ADR [15:8]) 606, a third address section (labeled REG ADR [7:0]) 608, payload sections (labeled DATA MSB[7:0] thru DATA LSB[7:0]) 610A-610G, a first CRC section (labeled CRC[15:8]) 612, and a second CRC section (labeled CRC [7:0]) 614. The initiation section 602 indicates the length of the data payload as a number of bytes. The first address section 604 indicates a device address (e.g., indicating a given modular subsystem). The second and third address sections 606 and 608 indicate a start address in a particular register space within the device indicated by the first address section 604. The memory range is indicated in the DATA MSB byte 610A. The payload sections 610A-610G carry data such as parameter values. The first and second CRC sections 612 and 614 indicate CRC data. In operation, the CSU 510 sends back the number of data bytes in payload sections 610A-610G. Upon receipt, the MCU 504 compares the number of data bytes requested with the number of data bytes actually sent. If the comparison shows a match, there is no error. If the comparison shows a mismatch, an error is indicated (e.g., see Table 1).

As an example, if the MCU 504 needs 54 bytes of functional safety-relevant data from the CSU 510, and the frame length variance range is 3, then 54 bytes here represents $L_{PL\_F}$ in Equation 1 and the number 3 represents the maximum number of different positions that $L_{PL\_V}$ from Equation 1 need to reach. That means the $L_{PL\_V}$ will cycle between values 0-1-2. The example of a periodical update of functional safety-relevant data is given in FIG. 7. Verification of the correct $L_{PL\_V}$ value here allows the system to comply with IEC61784-3 (section 5.4.2) and ISO26262-5 (section D.2.5.7).

Figure 7:
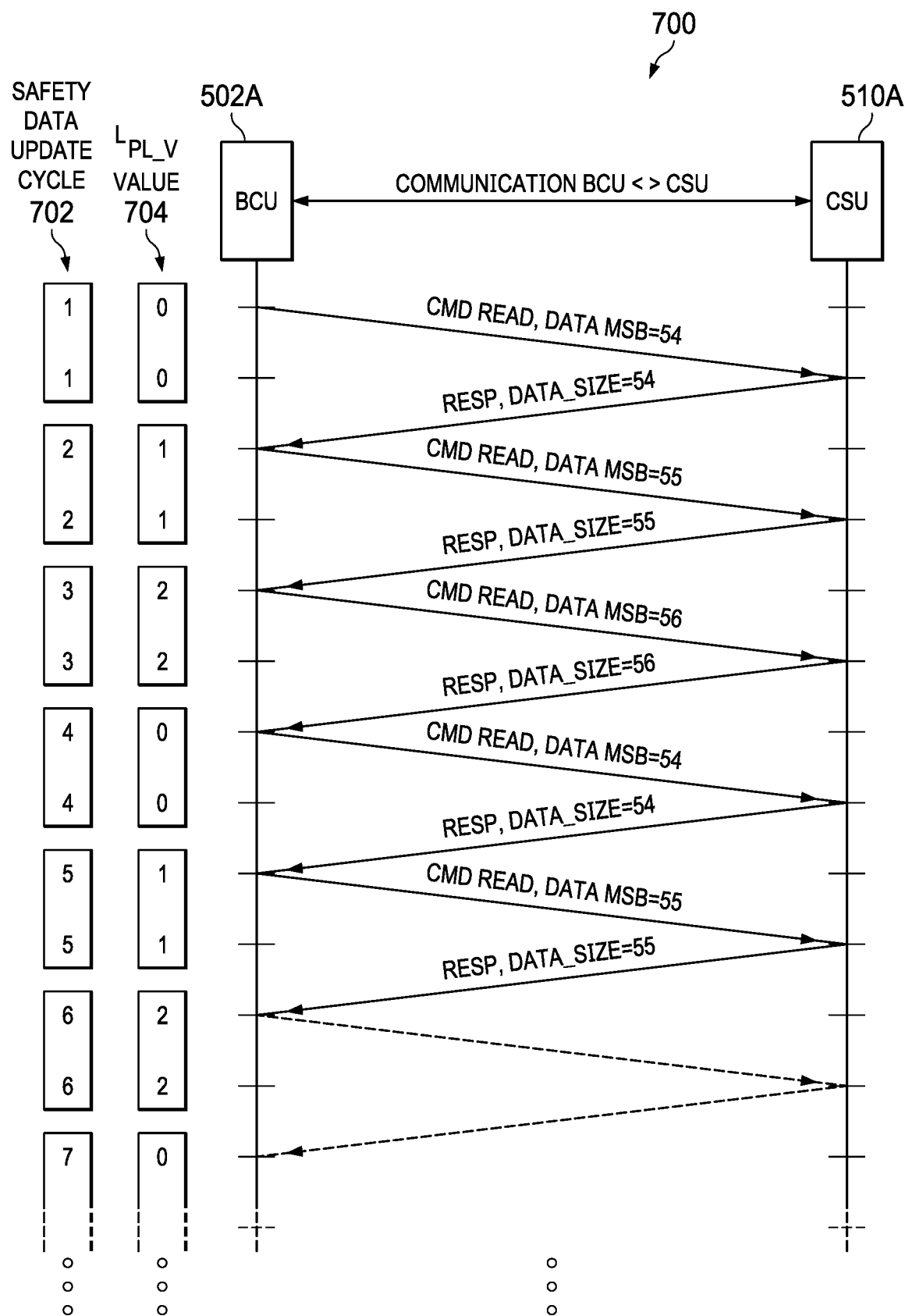
FIG. 7 is a diagram of communication cycles with variable frame length in accordance with an example embodiment.

FIG. 7 is a diagram 700 of communication cycles with variable frame length in accordance with an example embodiment. In the diagram 700, a BCU 502A (an example of the BCU 502 in FIG. 5) is in communication with a CSU 510A (an example of the CSU 510 in FIG. 5. As shown, there are 6 full safety data update cycles 702. Also, the $L_{PL\_V}$ value 704 varies for each of the cycles 702 in the pattern shown (0, 1, 2, 0, 1, 2). With $L_{PL\_V}=0$, the number of data bytes in the payload is 54 bytes. In such case, the BCU 502A sends a read command to read 54 bytes (CMD Read, DATA MSB=54), and the CSU 510A responds with 54 bytes (RESP, DATA_SIZE=54). With $L_{PL\_V}=1$, the number of data bytes in the payload is 55 bytes. In such case, the BCU 502A sends a read command 55 bytes (CMD Read, DATA MSB=55), and the CSU 510A responds with 55 bytes (RESP, DATA_SIZE=55). With $L_{PL\_V}=2$, the number of data bytes in the payload is 56 bytes. In such case, the BCU 502A sends a read command 56 bytes (CMD Read, DATA MSB=56), and the CSU 510A responds with 56 bytes (RESP, DATA_SIZE=56). The variable frame length pattern repeats in the diagram 700. Although $L_{PL\_V}$ of 0, 1, and 2 provides a useable variable frame length pattern, it should be appreciated that other $L_{PL\_V}$ values are possible.

Figure 8:
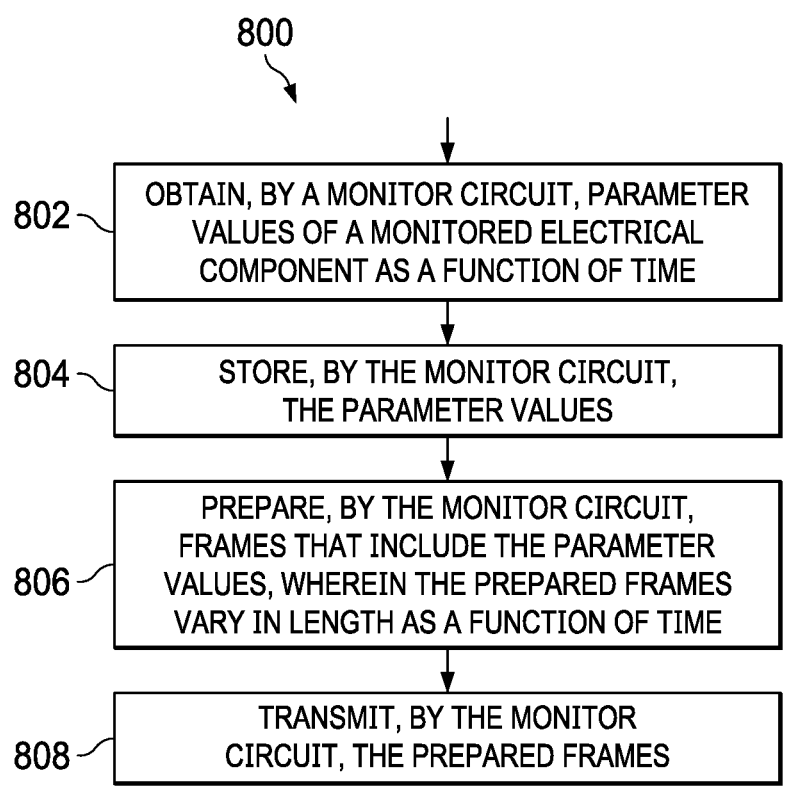
FIG. 8 is a method for emulating a frame counter in a communication system with a primary controller and modular subsystems in accordance with an example embodiment.

FIG. 8 is a method 800 for emulating a frame counter in a communication system (e.g., one of the systems 100, 200, and 300 in FIGS. 1-3) with a primary controller (e.g., the primary controller 102 in FIG. 1, the primary controller 102A in FIG. 2, the primary controller 102B in FIG. 3, the BCU 502 in FIG. 5, and the BCU 502A in FIG. 7) and modular subsystems (e.g., the modular subsystems 112A-112N in FIG. 1, the modular subsystems 222A-222N in FIG.

2). The method 800 includes obtaining, by a monitor circuit (e.g., the monitor circuit 122 in FIG. 1, the monitor circuit 122A in FIG. 2, or the CSU 510 in FIG. 5, or the CSU 510A in FIG. 7), parameter values of a monitored electrical component (e.g., a rechargeable battery or other monitored electrical component) as a function of time at block 802. At block 804, the parameter values are stored by the monitor circuit. At block 806, the monitor circuit prepares frames that include the parameter values, wherein the prepared frames vary in length as a function of time. At block 808, the monitor circuit transmits the prepared frames.

In some example embodiments, preparing the frames with different lengths as a function of time in block 806 is based on a predetermined frame length pattern. In some example embodiments, the method 800 includes: the monitor circuit receiving parameter queries, each of the parameter queries including a frame length indicator; and the monitor circuit preparing the frames based on the frame length indicators. In some example embodiments, the method 800 includes: receiving, by the primary controller, the prepared frames; extracting, by the primary controller, a frame length from each received frame; comparing, by the primary controller, each extracted frame length to an expected frame length; if an extracted frame length matches its expected frame length, accepting, by the primary controller, a respective frame; and if an extracted frame length does not match its expected frame length, asserting by the primary controller, an error signal.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A monitor circuit for use in a management system with modular subsystems, the monitor circuit comprising:
   a sensor configured to measure parameter values of a monitored electrical component as a function of time;
   storage coupled to the sensor and configured to store the parameter values;
   a communication interface configured to receive information from a primary controller of the management system; and
   frame preparation circuitry coupled to the storage and configured to prepare frames that include the parameter values, wherein the frame preparation circuitry is configured to:
      prepare a first frame including a first header, and a first payload portion including a fixed length portion and a second payload portion; and
      prepare a second frame including a second header, and a third payload portion including a fixed length portion and a fourth payload portion, wherein the second payload portion includes fewer dummy bytes than the fourth payload portion, and wherein a length of the fixed length portion of the first and third payload portions is the same.

2. The monitor circuit of claim 1, wherein the frame preparation circuitry is configured to prepare frames with different lengths as a function of time based on a predetermined frame length pattern stored or generated by the frame preparation circuitry.

3. The monitor circuit of claim 1, wherein the communication interface is configured to receive the information with a first parameter query from the primary controller, and wherein the frame preparation circuitry is configured to prepare frames with different lengths as a function of time based on the information included with each parameter query received from the primary controller.

4. The monitor circuit of claim 1, wherein the frame preparation circuitry is configured to prepare frames with different lengths as a function of time based on different frame length settings included with parameter queries received from the primary controller.

5. The monitor circuit of claim 1, wherein the frame preparation circuitry is configured to prepare frames with different lengths as a function of time as a response to individual queries from the primary controller.

6. The monitor circuit of claim 5, wherein the frame preparation circuitry is configured to:
   obtain a frame length setting from each of the individual queries; and
   use the frame length setting to prepare response frames for each of the individual queries.

7. The monitor circuit of claim 6, wherein the monitored electrical component is a battery of an electrical vehicle.

8. The monitor circuit of claim 1, wherein the sensor is a voltage sense circuit or current sense circuit, and the monitored electrical component is a battery.

9. The monitor circuit of claim 1, wherein a length of the first and second headers is the same.

10. The monitor circuit of claim 1, wherein the fourth payload portion includes a single dummy byte.

11. The monitor circuit of claim 1, wherein the communication interface is configured to transmit the first and second frames sequentially.

12. The monitor circuit of claim 11, wherein the communication interface is configured to transmit the first frame as a next frame after the second frame.

13. The monitor circuit of claim 1, wherein the communication interface is configured to wirelessly receive the information from the primary controller.

14. The monitor circuit of claim 1, wherein the first header includes length information of the first payload portion.

15. A system, comprising:
   a primary controller; and
   modular subsystems in communication with the primary controller, each of the modular subsystems having:
      an electrical component; and
      a monitor circuit coupled to the electrical component and configured to:
         obtain parameter values from monitoring the electrical component;
         store the parameter values;
         receive information from the primary controller; and
         prepare frames with the stored parameter values for transmission to the primary controller, wherein preparing the frames comprises preparing a first frame including a first header, and a first payload portion including a fixed length portion and a second payload portion; and preparing a second frame including a second header, and a third payload portion including a fixed length portion and a fourth payload portion, wherein the second payload portion includes fewer dummy bytes than the fourth payload portion, and wherein a length of the fixed length portion of the first and third payload portions is the same.

16. The system of claim 15, wherein the monitor circuit includes frame preparation circuitry configured to prepare frames with different lengths as a function of time based on a predetermined frame length pattern stored or generated by the frame preparation circuitry.

17. The system of claim 15, wherein the monitor circuit includes frame preparation circuitry configured to prepare frames with different lengths as a function of time based on a setting included with each parameter query received from the primary controller.

18. The system of claim 15, wherein the monitor circuit includes frame preparation circuitry configured to prepare frames with different lengths as a function of time based on different frame length settings included with parameter queries received from the primary controller.

19. The system of claim 15, wherein the monitor circuit includes frame preparation circuitry configured to prepare frames with different lengths as a function of time as a response to individual queries from the primary controller.

20. The system of claim 19, wherein the frame preparation circuitry is configured to:
obtain a frame length setting from each of the individual queries; and
use the obtained frame length settings to prepare response frames for each of the individual queries.

21. The system of claim 15, further comprising:
a primary wireless communication interface coupled to the primary controller; and
a secondary wireless communication interface for each respective modular subsystem, wherein the monitored electrical component is a battery.

22. A method for emulating a frame counter in a communication system with a primary controller and modular subsystems, the method comprising:
obtaining, by a monitor circuit, parameter values of a monitored electrical component as a function of time;
storing, by the monitor circuit, the parameter values;
receiving, by the monitor circuit, information from the primary controller;
preparing, by the monitor circuit, frames that include the parameter values, wherein preparing the frames comprises:
preparing a first frame including a first header, and a first payload portion including a fixed length portion and a second payload portion, and
preparing a second frame including a second header, and a third payload portion including a fixed length portion and a fourth payload portion, wherein the second payload portion includes fewer dummy bytes than the fourth payload portion, and wherein a length of the fixed length portion of the first and third payload portions is the same; and
transmitting, by the monitor circuit, the prepared frames.

23. The method of claim 22, wherein preparing the frames with different lengths as a function of time is based on a predetermined frame length pattern.

24. The method of claim 22, further comprising:
receiving by the monitor circuit, parameter queries, each of the parameter queries including a frame length indicator; and
preparing, by the monitor circuit, the frames based on the frame length indicators.

25. The method of claim 22, further comprising:
receiving, by the primary controller, the prepared frames;
extracting, by the primary controller, a frame length from each received frame;
comparing, by the primary controller, each extracted frame length to an expected frame length;
if an extracted frame length matches its expected frame length, accepting, by the primary controller, a respective frame; and
if an extracted frame length does not match its expected frame length, asserting by the primary controller, an error signal.

* * * * *